(12) United States Patent
Schneegans et al.

(10) Patent No.: US 8,816,500 B2
(45) Date of Patent: Aug. 26, 2014

(54) SEMICONDUCTOR DEVICE HAVING PERIPHERAL POLYMER STRUCTURES

(71) Applicant: Infineon Technologies AG, Neubiberg (DE)

(72) Inventors: Manfred Schneegans, Vaterstetten (DE); Ivan Nikitin, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/715,868

(22) Filed: Dec. 14, 2012

(65) Prior Publication Data

US 2014/0167266 A1    Jun. 19, 2014

(51) Int. Cl.
*H01L 23/48* (2006.01)
*H01L 23/52* (2006.01)
*H01L 29/40* (2006.01)

(52) U.S. Cl.
USPC ............ 257/741; 257/E23.019; 257/E23.041; 257/E23.142

(58) Field of Classification Search
USPC ............ 257/741, E23.019, E23.041, E23.142
See application file for complete search history.

(56) References Cited

U.S. PATENT DOCUMENTS

| | | | | |
|---|---|---|---|---|
| 7,191,515 | B2 * | 3/2007 | Sundahl et al. | 29/830 |
| 8,084,302 | B2 * | 12/2011 | Do et al. | 438/127 |
| 8,120,188 | B2 * | 2/2012 | Sakurai et al. | 257/778 |
| 2004/0087043 | A1 * | 5/2004 | Lee et al. | 438/6 |
| 2005/0031174 | A1 * | 2/2005 | Ryhanen et al. | 382/124 |
| 2006/0255462 | A1 * | 11/2006 | Farrar | 257/751 |
| 2008/0136009 | A1 * | 6/2008 | Theuss et al. | 257/690 |
| 2008/0157341 | A1 * | 7/2008 | Yang et al. | 257/700 |
| 2009/0032960 | A1 * | 2/2009 | Pratt | 257/773 |
| 2010/0273288 | A1 * | 10/2010 | Farnworth | 438/66 |
| 2011/0217813 | A1 * | 9/2011 | Wang | 438/113 |
| 2011/0281400 | A1 * | 11/2011 | Fryklund et al. | 438/118 |
| 2011/0306167 | A1 * | 12/2011 | Lee et al. | 438/114 |
| 2012/0025378 | A1 * | 2/2012 | Lin | 257/746 |
| 2013/0001776 | A1 * | 1/2013 | Yu et al. | 257/738 |
| 2013/0105979 | A1 * | 5/2013 | Yu et al. | 257/762 |
| 2013/0122689 | A1 * | 5/2013 | Wang et al. | 438/464 |

* cited by examiner

*Primary Examiner* — Ida M Soward
(74) *Attorney, Agent, or Firm* — Slater & Matsil, L.L.P.

(57) ABSTRACT

A semiconductor device includes a semiconductor chip including a first main face and a second main face wherein the second main face is the backside of the semiconductor chip. Further, the semiconductor device includes an electrically conductive layer, in particular an electrically conductive layer, arranged on a first region of the second main face of the semiconductor chip. Further, the semiconductor device includes a polymer structure arranged on a second region of the second main face of the semiconductor chip, wherein the second region is a peripheral region of the second main face of the semiconductor chip and the first region is adjacent to the second region.

19 Claims, 7 Drawing Sheets

SEMICONDUCTOR DEVICE HAVING PERIPHERAL POLYMER STRUCTURES

TECHNICAL FIELD

The invention relates to a semiconductor device and a method of manufacturing the same, and more particularly to the technology of separating a semiconductor substrate such as, e.g., a wafer into semiconductor units such as, e.g., chips.

BACKGROUND

Semiconductor device manufacturers are constantly striving to increase the performance of their products, while decreasing their cost of manufacture. A cost intensive area in the manufacture of semiconductor devices is packaging the semiconductor chips. As those skilled in the art are aware, integrated circuits are fabricated on wafers, which are then singulated to produce semiconductor chips. Subsequently, the semiconductor chips may be mounted on electrically conductive carriers, such as lead frames. Packaging methods providing high yield at low expenses are desirable.

For these and other reasons, there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description.

DETAILED DESCRIPTION OF ILLUSTRATIVE EMBODIMENTS

Aspects and embodiments are now described with reference to the drawings, wherein like reference numerals are generally utilized to refer to like elements throughout. In the following description, for purposes of explanation, numerous specific details are set forth in order to provide a thorough understanding of one or more aspects of the embodiments. It may be evident, however, to one skilled in the art that one or more aspects of the embodiments may be practiced with a lesser degree of the specific details. In other instances, known structures and elements are shown in schematic form in order to facilitate describing one or more aspects of the embodiments. The following description is therefore not to be taken in a limiting sense, and the scope is defined by the appended claims. It should also be noted that the representations of the various layers, sheets or substrates in the figures are not necessarily to scale.

In the following detailed description, reference is made to the accompanying drawings, which form a part thereof, and in which is shown by way of illustration specific embodiments in which the invention may be practiced. In this regard, directional terminology, such as "top," "bottom," "front," "back," "leading," "trailing," etc., is used with reference to the orientation of the figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

As employed in this specification, the terms "coupled" and/or "electrically coupled" are not meant to mean that the elements must be directly coupled together; intervening elements may be provided between the "coupled" or "electrically coupled" elements.

The semiconductor chips described further below may be of different types, may be manufactured by different technologies and may include for example integrated electrical, electro-optical or electro-mechanical circuits and/or passives. The semiconductor chips may, for example, be configured as power semiconductor chips. Furthermore, the semiconductor chips may include control circuits, microprocessors or microelectromechanical components. Furthermore, the devices described below may include logic integrated circuits to control the integrated circuits of other semiconductor chips, for example the integrated circuits of power semiconductor chips. The semiconductor chips need not be manufactured from specific semiconductor material, for example Si, SiC, SiGe, GaAs, and, furthermore, may contain inorganic and/or organic materials that are not semiconductors, such as for example insulators, plastics or metals.

Semiconductor devices containing such semiconductor chips are described below. In particular, semiconductor chips having a vertical structure may be involved, that is to say that the semiconductor chips may be fabricated in such a way that electric currents can flow in a direction perpendicular to the main faces of the semiconductor chips. A semiconductor chip having a vertical structure has electrodes on its two main faces, that is to say on its top side and bottom side (the bottom side is also referred to as backside herein).

In particular, the semiconductor device may include a power semiconductor chip. Power semiconductor chips may have a vertical structure. The vertical power semiconductor chips may, for example, be configured as power MOSFETs (Metal Oxide Semiconductor Field Effect Transistors), IGBTs (Insulated Gate Bipolar Transistors), JFETs (Junction Gate Field Effect Transistors), power bipolar transistors or power diodes. By way of example, the source electrode and gate electrode of a power MOSFET may be situated on one main face, while the drain electrode of the power MOSFET is arranged on the other main face.

The semiconductor chips may have contact pads (or electrodes) which allow electrical contact to be made with the integrated circuits included in the semiconductor chips. The electrodes may include one or more electrode metal layers which are applied to the semiconductor material of the semiconductor chips. The electrode metal layers may be manufactured with any desired geometric shape and any desired material composition. The electrode metal layers may, for example, be in the form of a layer covering an area. Any desired metal, for example Cu, Ni, Sn, Au, Ag, Pt, Pd, and an alloy of one or more of these metals may be used as the material. The electrode metal layer(s) need not be homogenous or manufactured from just one material, that is to say various compositions and concentrations of the materials contained in the electrode metal layer(s) are possible.

In several embodiments one or more conductive layers, in particular electrically conductive layers, are applied. It should be appreciated that any such terms as "formed" or "applied" are meant to cover literally all kinds and techniques of applying layers. In particular, they are meant to cover techniques in which layers are applied at once as a whole like, for example, laminating techniques as well as techniques in which layers are deposited in a sequential manner like, for example, sputtering, plating, molding, CVD (Chemical Vapor Deposition), PVD (physical vapor deposition), evaporation, hybrid physical-chemical vapor deposition (HPCVD), etc.

The applied conductive layer may comprise, inter alia, one or more of a layer of metal such as Cu or Sn or an alloy thereof, a layer of a conductive paste, and a layer of a bond material. The layer of a metal may be a homogeneous layer. The conductive paste may contain metal particles distributed in a vaporizable or curable polymer material, wherein the paste may be fluid, viscous or waxy. The bond material may be applied to electrically and mechanically connect the semiconductor chip, e.g., to a carrier or, e.g., to a contact clip. A soft solder material or, in particular, a solder material capable of forming diffusion solder bonds may be used, for example solder material comprising one or more of Sn, SnAg, SnAu, SnCu, In, InAg, InCu and InAu.

A dicing process may be used to divide the wafer into individual chips. Any technique for dicing may be applied, e.g., blade dicing (sawing), laser dicing, etching, etc. In particular, stealth dicing, which is a specific technique using laser dicing may be applied. Stealth dicing allows suppressing cutting waste and is therefore a suitable process for cutting work pieces that are vulnerable to contamination. Further, it is a dry process that does not require cleaning, and is therefore also suitable for processing sensitive structures such as, e.g., MEMS, that are vulnerable to load. Further benefits which may be achieved by the stealth dicing technology are high-speed dicing, superior breakage strength, small kerf and low running costs.

In stealth dicing technology, a laser beam of a wavelength capable of transmitting through the semiconductor wafer is focused onto a point inside the semiconductor wafer. Due to a non-linear absorption effect, only localized points inside the semiconductor wafer may be selectively laser-machined, whereby damaging of the front and back surface of the semiconductor wafer may be avoided. The semiconductor wafer can be diced by moving the relative positions of the laser beam and the semiconductor wafer in order to scan the semiconductor wafer according to the desired dicing pattern.

The semiconductor wafer may be diced by applying the semiconductor wafer on a tape, in particular a dicing tape, apply the dicing pattern, in particular a rectangular pattern, to the semiconductor wafer, e.g., according to one or more of the above mentioned techniques, and pull the tape, e.g., along four orthogonal directions in the plane of the tape. By pulling the tape, the semiconductor wafer gets divided into a plurality of semiconductor dies (chips).

Figure 1A:
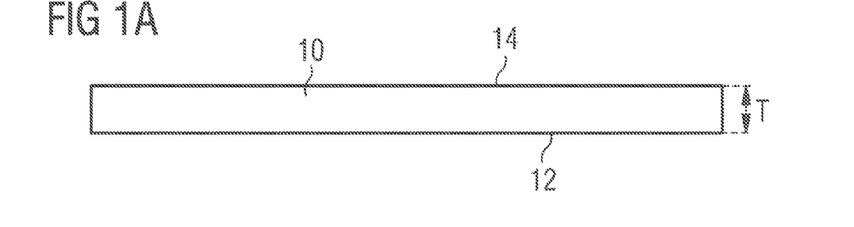
FIGS. 1A-1E schematically illustrate cross-sectional views of one embodiment of a method of manufacturing a semiconductor device.

FIGS. 1A-1E schematically illustrate a method of manufacturing a semiconductor device 100 in accordance with one embodiment. FIG. 1A schematically illustrates providing a semiconductor wafer 10 having a first main face 12 and a second main face 14 wherein the second main face 14 is the backside of the semiconductor wafer 10. In FIG. 1A the backside of the semiconductor wafer 10 is depicted as the upper main face of the semiconductor wafer 10. The semiconductor wafer 10 may, e.g., have a thickness T. The semiconductor wafer 10 may, e.g., be disc-shaped having a rounded outline and the diameter of the semiconductor wafer 10 may, e.g., be equal to or greater than 200 or 300 mm.

The semiconductor wafer 10 as shown in FIG. 1A may have been thinned in a previous step (not shown in FIGS. 1A-1E). The thinned surface may, e.g., be the second main face 14 of the semiconductor wafer 10. The front side of the semiconductor wafer 10 may have been processed during front-end wafer processing to produce active structures such as, e.g., integrated circuits, pn junctions, transistors, micromechanical structures, etc. Processing the front side may be carried out before or after thinning the backside of the semiconductor wafer 10. It is also possible that the thinned surface may, e.g., be the first main face 12 of the semiconductor wafer 10. In this case the front side of the wafer 10 is processed after thinning the front side. Thinning the semiconductor wafer 10 may comprise at least one of mechanical thinning, in particular grinding, chemical mechanical polishing (CMP), and wet etching. Thinning the semiconductor wafer 10 may also comprise all of the aforementioned processes.

After (optional) thinning, the semiconductor wafer 10 may, e.g., have a thickness T smaller than 100 µm, in particular smaller than 60 µm, and more in particular smaller than 40 µm or even 30 µm.

Figure 1B:
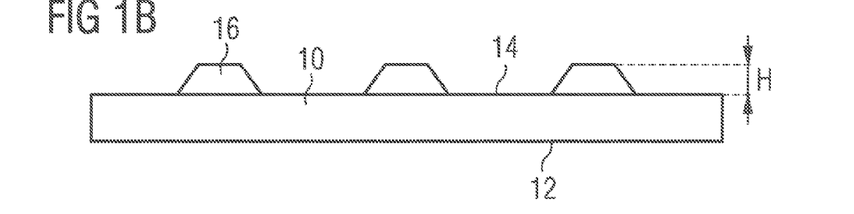

Referring to FIG. 1B, a plurality of polymer stripes 16 is formed on the second main face 14 of the semiconductor wafer 10. In FIG. 1B, the plurality of polymer stripes 16 may be formed by applying a polymer on the second main face 14 of the semiconductor wafer 10 by, e.g., spin coating, prebaking the resist-coated wafer, lithographic patterning of the photoresist, and hard baking (curing) the photoresist. The polymer stripes 16 may, e.g., comprise an imide, in particular a photoimide, a photoresist, a thermosetting material or a thermoplastic material.

At least one of the plurality of polymer stripes 16 may, e.g., have a thickness or height H between 3 and 50 µm, in particular between 6 and 25 µm, more in particular between 9 and 15 µm. At least one of the plurality of polymer stripes 16 may, e.g., have a bottom width (at the second main face 14) between 5 and 100 µm, in particular between 10 and 60 µm. A top width (at the exposed top face of the polymer stripes 16) may, e.g., be identical or smaller than the bottom width.

The width of at least one of the plurality of polymer stripes 16 may, e.g., decrease from the second main face 14 in a direction away from the semiconductor wafer 10. The polymer stripes 16 may, e.g., have a trapezoid or rectangular cross-section.

The polymer stripes 16 may, e.g., be arranged equidistantly. The plurality of polymer stripes 16 may, e.g., be formed using at least one of lithography, in particular photolithography, printing, and dispensing.

Figure 1C:
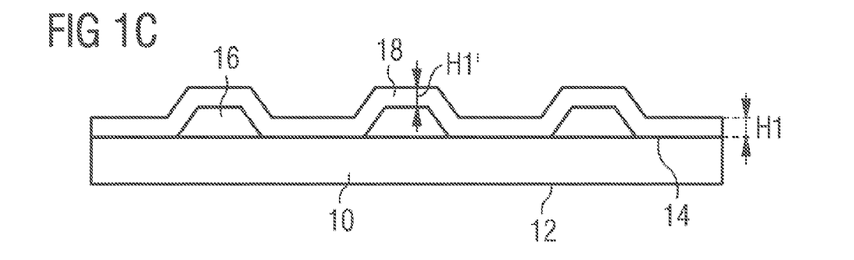

FIG. 1C illustrates forming a conductive layer 18, in particular an electrically conductive layer, on the plurality of polymer stripes 16 and on the second main face 14 of the semiconductor wafer 10. The conductive layer 18 may, e.g., be a first metallization layer 22, i.e., a layer that comprises or consists of a first material. The first material may, e.g., be a metal. The first material may, e.g., comprise or consist of one of Cu, Sn, and an alloy of one or more of these metals. The first metallization layer 22 may, e.g., be homogeneous. By way of example, the first metallization layer 22 of FIG. 1C may be formed by sputtering a copper layer. However, as will be explained further below in conjunction with FIGS. 4A-4E, the conductive layer 18 may also comprise or consist of a metal paste containing metal particles dispersed within an organic material, in particular a nano paste, a solder paste, in particular a diffusion solder paste and a conductive adhesive.

Forming the conductive layer 18 (e.g., the first metallization layer 22) on the plurality of polymer stripes 16 and on the second main face 14 of the semiconductor wafer 10 may, e.g., comprise at least one of sputtering, CVD, PVD, electroplating, electroless plating, and spray plating. As will be explained further below in conjunction with FIGS. 4A-4E, the conductive layer 18 may, e.g., also be formed by at least one of squeegeeing, printing, dispensing, laminating, and spin-coating.

The thickness of the conductive layer 18 (e.g., first metallization layer 22) may, e.g., be H1 in regions between adjacent polymer stripes 16. The thickness of the conductive layer 18 on top of one of the plurality of polymer stripes 16 may, e.g., be H1'. H1 and H1' may, e.g., about be the same or may, e.g., be different. The thickness H of the plurality of polymer stripes 16 may, e.g., be greater than H1. Alternatively, the thickness H of the plurality of polymer stripes 16 may, e.g., be smaller than or equal to H1. H1 may, e.g., be greater or smaller than 5, 10, 15, 20, 25, 30, 50 µm.

After the conductive layer 18 has been formed, the conductive layer 18 and the plurality of polymer stripes 16 may, e.g., be identical in thickness. The formed conductive layer 18 may, e.g., have a thickness H1 different from the thickness H of the plurality of polymer stripes 16.

Figure 1D:
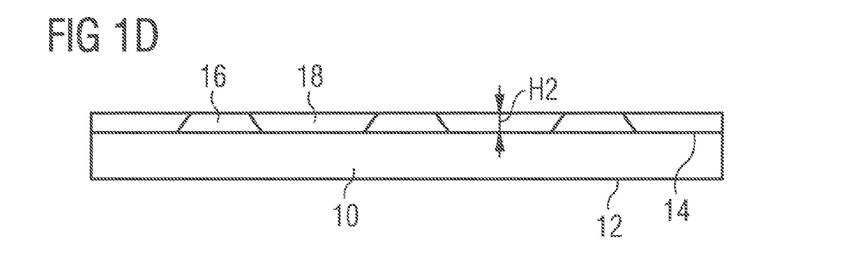

FIG. 1D illustrates planarizing the conductive layer 18. The conductive layer 18 (e.g., the first metallization layer 22) may be planarized by using a mechanical planarization technique such as, e.g., at least one of grinding, milling, cutting, and chemical mechanical polishing (CMP). For planarizing the conductive layer 18 a surface planer may be used such as, e.g., the surface planer produced by the Japanese Disco Corporation, in the particular the surface planer DFS 8910 may, e.g., be used.

Both the conductive layer 18 and the plurality of polymer stripes 16 may, e.g., be planarized. In this case, as illustrated in FIG. 1D, the plurality of polymer stripes 16 is exposed. That is, the plurality of polymer stripes 16 are exposed at the surface of the semiconductor device 100 and the conductive layer 18 is transformed or structured into a plurality of separated stripes or lands, each of which is arranged between adjacent polymer stripes 16.

FIG. 1D illustrates that after planarization, the upper surface of the (structured) conductive layer 18 levels with the upper (exposed) surface of the plurality of polymer stripes 16. Further, the lower surface of the conductive layer 18 may level with the lower surface of the plurality of polymer stripes 16. The plurality of polymer stripes 16 and the (structured) conductive layer 18 may thus have the same thickness H2. It is to be noted that H2 may be smaller than H, i.e., that the exposed surfaces of the polymer stripes 16 in FIG. 1D are surfaces created by planarization. The exposed surfaces of the plurality of polymer stripes 16 and the upper surfaces of the structured conductive layer 18 may completely cover the second main face 14 of the semiconductor wafer 10.

The thickness H2 of the conductive layer 18 may be greater than 1, 3, 10, 15, 20, 25, or 50 µm. In particular for power semiconductor chips a thickness H2 of at least 10 µm or more may be desired. The exposed surfaces of the plurality of polymer stripes 16 and the upper surfaces of the structured conductive layer 18 may completely cover the second main face 14 of the semiconductor wafer 10.

According to another possibility (not shown), after planarizing the conductive layer 18 may, e.g., still be continuous, more particularly may, e.g., still completely cover the semiconductor wafer 10. In this case, there may be a thin residual layer of conductive material left on top of the plurality of the polymer stripes 16, and the plurality of polymer stripes 16 is not exposed. The thin residual layer of conductive material left on top of the plurality of the polymer stripes 16 may be as thin as not to overly impede the division process, i.e., may, e.g., be smaller than 5, 3 or 1 µm.

Figure 1E:
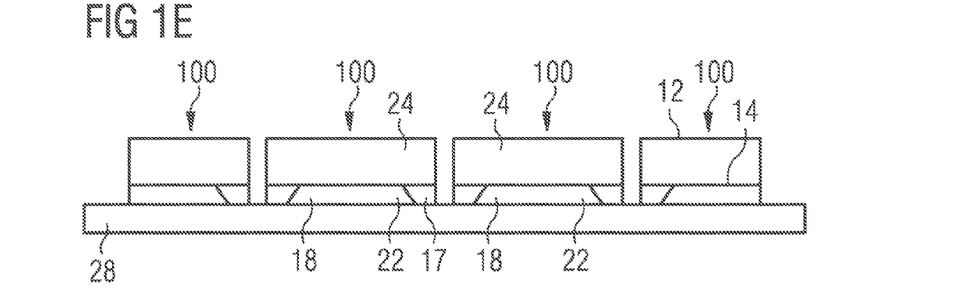

FIG. 1E illustrates dividing the semiconductor wafer 10 into a plurality of semiconductor chips 24 or semiconductor devices 100, e.g., by sawing, laser dicing or etching. To this end, the semiconductor wafer 10 may, e.g., be placed on a dicing tape 28 with the second main face 14 facing the dicing tape 28, as shown in FIG. 1E. The semiconductor wafer 10 may be divided from the first main face 12 to the second main face 14 and through at least one of the plurality of polymer stripes 16. The division line may, e.g., run perpendicular to the first main face 12 and the second main face 14 of the semiconductor wafer 10. Further, the division line may run along the stripe 16, i.e., the division line may extend between the side flanges of the stripe 16 and may, e.g., correspond to the central axis of the stripe 16.

The semiconductor chip 24 may, e.g., be separated by a single cut from the first main face 12 to the second main face 14 of the semiconductor wafer 10. The semiconductor chip 24 may, e.g., be separated by a step cut from the first main face 12 to the second main face 14 of the semiconductor wafer 10. The step cut may, e.g., comprise sawing the semiconductor wafer 10 with a first saw blade having a first width to produce grooves (not shown) and subsequent sawing the semiconductor wafer 10 with a second saw blade having a second width which is smaller than the first width to complete the division process. That is, sawing with the second saw blade may, e.g., be done until the second saw blade hits or cuts into the dicing tape 28. In case a process of dicing before grinding (DBG) has been applied to the semiconductor wafer 10, the semiconductor wafer 10 may be divided, in particular sawn, by starting from the grooves which have been cut in the first main face 12 using the first saw blade. The width of the second saw blade used for completing the dicing may be smaller than the width of the grooves. Irrespective of performing a single cut or a step cut, the width of the (second) saw blade may be smaller than the width of the polymer stripe 16.

The semiconductor wafer 10 may, e.g., also be cut through at least one of the plurality of polymer stripes 16 and from the second main face 14 towards the first main face 12 of the semiconductor wafer 10. In this case the semiconductor wafer 10 may, e.g., be placed on the dicing tape 28 with the first main face 12 facing the dicing tape 28.

By dividing the semiconductor wafer 10 through at least one of the plurality of polymer stripes 16, this polymer stripe 16 is split up into two polymer structures 17 wherein one polymer structure 17 is associated with a first semiconductor device 100 and the other polymer structure 17 is associated with a second semiconductor device 100 adjacent to the first semiconductor device 100. In FIG. 1E four semiconductor devices 100 are shown, wherein the two semiconductor devices 100 depicted on the left and on the right hand side of FIG. 1E are equipped with a polymer structure 17 only at one of their side faces depicted in FIG. 1E.

As mentioned above, semiconductor wafer 10 is divided in a direction along at least one of the plurality of polymer stripes 16. The polymer stripes 16 may thus run along dicing kerfs of the semiconductor wafer 10. The viscoelastic material of the polymer stripes 16 may lower the tensile stress occurring at the edge of the second main face of the semiconductor chip 24 when dividing the semiconductor wafer 10 compared to the case of dividing a wafer having a continuous, unpatterned backside metallization. Thus, chip crack propagation or chipping as caused by tensile stress at the chip edge may be avoided by protecting the chip cutting edge by the polymer structure 17.

Further, if the material of the conductive layer 18 is completely removed from the top surfaces of the stripes 16 during planarization, no conductive material (e.g., metal) is cut when dividing the semiconductor wafer 10 into chips 24. This facilitates the process of chip separation and/or device fabrication. Even if a thin residual layer (not shown) of conductive material (e.g., metal) remains on the top surfaces of the polymer stripes 16 after planarization, the process of chip separation and/or device fabrication may still benefit from the reduced thickness of the conductive layer at the dicing kerfs (and, additionally, from the polymer chip edge protection).

Further, the polymer structures 17 of singulated semiconductor chips 24 may, e.g., protect the chip edges during subsequent handling such as, e.g., placement of chips on top of a carrier such as, e.g., a lead frame. The patterning of the backside metallization by, e.g., polymer stripes 16 and a process to remove the metal on the polymer stripes 16 enable and improves the ongoing use of conventional dicing methods like, e.g., sawing or laser dicing (e.g., stealth dicing) of wafers.

The semiconductor wafer 10 may, e.g., be divided multiple times along adjacent parallel and/or crossing polymer stripes 16. By doing this, a semiconductor device 100 is singulated from the semiconductor wafer 10. The semiconductor device 100 may, e.g., comprise the conductive layer 18 (e.g., metal layer) as the backside metallization and two polymer structures 17 arranged along two opposite edges at the second main face 14 of the semiconductor chip 24. In particular, the semiconductor device 100 may comprise the conductive layer 18 as the backside metallization and four polymer structures 17 arranged along all four edges at the second main face 14 of the semiconductor chip 24.

The second main face 14 of the semiconductor device 100 may, e.g., be attached on a carrier by gluing, soldering, or sintering. In case the semiconductor device 100 is attached by soldering, a soft solder or a diffusion solder may be used to attach the semiconductor device 100. The semiconductor chip 24 may, e.g., be attached with the second main face 14 on the carrier. The carrier may, e.g., be one of a lead frame, a ceramics substrate such as, e.g., a DCB (direct copper bonded) ceramics substrate, and a printed circuit board (PCB).

FIGS. 2A-2E schematically illustrate a method of manufacturing a semiconductor device 200 in accordance with one embodiment. This method is similar to the method described in the FIGS. 1A-1E; however it comprises forming a base metallization layer 20 on the plurality of polymer stripes 16 and on the second main face 14 of the semiconductor wafer 10, before the first metallization layer 22 is formed on the base metallization layer 20.

Figure 2A:
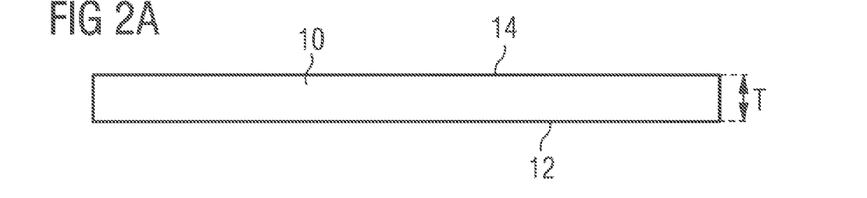
FIGS. 2A-2E schematically illustrate cross-sectional views of one embodiment of a method of manufacturing a semiconductor device.

FIG. 2A schematically illustrates providing a semiconductor wafer 10 having a first main face 12 and a second main face 14 wherein the second main face 14 is the backside of the semiconductor wafer 10. The semiconductor wafer 10 which is depicted in FIG. 2A has the same features as the semiconductor wafer 10 of FIG. 1A. In particular this applies to the dimensions of the semiconductor wafer 10, and (optional) thinning the semiconductor wafer 10.

Figure 2B:
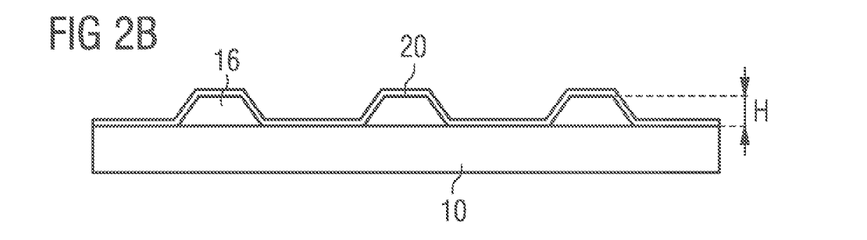

In FIG. 2B, a plurality of polymer stripes 16 is formed on the second main face 14 of the semiconductor wafer 10. The polymer stripes 16 of FIG. 2B have the same features as the polymer stripes 16 of FIG. 1B. In particular this applies to the material and the dimensions of the polymer stripes 16 and the method of forming the polymer stripes 16 on the semiconductor wafer 10.

Figure 2C:
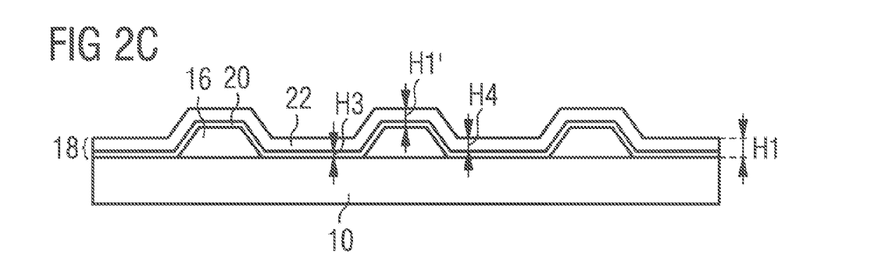

FIGS. 2B and 2C illustrate forming an electrically conductive layer 18 on the plurality of polymer stripes 16 and on the second main face 14 of the semiconductor wafer 10. The conductive layer 18 may, e.g., be an electrically conductive layer. The conductive layer 18 may comprise or consist of a base metallization layer 20 and the first metallization layer 22. FIG. 2B illustrates forming a base metallization layer 20 on the plurality of polymer stripes 16 and on the second main face 14 of the semiconductor wafer 10. FIG. 2C illustrates forming the first metallization layer 22 on the base metallization layer 20.

The base metallization layer 20 may, e.g., be formed using at least one of sputtering, CVD, PVD, electroplating, electroless plating, and spray plating. A material of the base metallization layer 20 may, e.g., be at least one of Au, Al, Ti, W, Cr, NiCo, Co, Cu, Sn, Ni, NiV, NiSn, Au, Ag, Pt, Pd, and an alloy of one or more of these metals.

The base metallization layer 20 of FIG. 2B may be a multi-layer structure (not shown). By way of example, the base metallization layer 20 may be manufactured by sputtering first a layer of Al, then a layer of Ti on the Al layer, and finally a layer of NiV on top of the Ti layer. The thickness of the Al layer may be about 200 nm, the thickness of the Ti layer may be about 400 nm and the thickness of the Ti layer may be about 200 nm. The total thickness H3 of the base metallization layer 20 may be between 50 and 2000 nm, in particular between 200 and 1000 nm.

After forming the base metallization layer 20 on the plurality of polymer stripes 16 and on the second main face 14 of the semiconductor wafer 10, the plurality of polymer stripes 16 may, e.g., be completely covered by the base metallization layer 20. More specifically, the base metallization layer 20 may be unstructured and may, e.g., completely cover the semiconductor wafer 10.

FIG. 2C illustrates forming the first metallization layer 22 on the base metallization layer 20. The first metallization layer 22 of FIG. 2C may have the same features and may be applied the same way as the first metallization layer 22 of FIGS. 1C-1E.

Figure 2D:
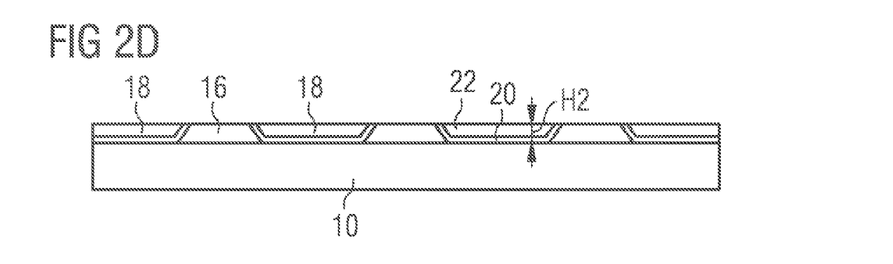

The first metallization layer 22 may be formed by depositing, e.g., sputtering, plating etc., a metal layer having a thickness H4. H4 may, e.g., be greater or smaller than 5, 10, 15, 20, 25, 30, 50 μm and may thus be in the same range as the thickness H1 of the first metallization layer 22 in FIGS. 1C-1E. Similar to FIGS. 1C-1E, the total thickness of the conductive layer 18 in FIGS. 2C-2D is denoted by H1 in regions between of polymer stripes 16 and H1' in regions on top of the polymer stripes 16. Here, H1 may equal the sum of the thickness H3 of the base metallization layer 20 and the thickness H4 of the first metallization layer 22. The values of H1 and H1' may, e.g., be the same as mentioned before or slightly greater due to the additional thickness H3 of the base metallization layer 20.

The first metallization layer 22 which is depicted in FIG. 2C may have the same features as the first metallization layer 22 of FIG. 1C. In particular this applies to the first material of the first metallization layer 22 and the method of forming the first metallization layer 22.

After the conductive layer 18 has been formed, the conductive layer 18 and the plurality of polymer stripes 16 may, e.g., be identical in thickness, the conductive layer 18 may, e.g., have a thickness H1 smaller than the thickness H of the plurality of polymer stripes 16 or the conductive layer 18 may, e.g., have a thickness H1 greater than the thickness H of the plurality of polymer stripes 16.

FIG. 2D illustrates planarizing the conductive layer 18 which comprises the base metallization layer 20 and the first metallization layer 22. The method shown in FIG. 2D may comprise the same features as the method shown in FIG. 1D. This applies in particular to the method for planarizing the conductive layer 18, the dimensions of the conductive layer 18 and the plurality of polymer stripes 16. This implies that in FIG. 2D, planarizing the conductive layer 18 may cause structuring both the base metallization layer 20 and the first metallization layer 22. Thus, the exposed surfaces of the plurality of polymer stripes 16 and the exposed upper surfaces of the structured conductive layer 18 may again completely cover the second main face 14 of the semiconductor wafer 10. Here, each of the exposed upper surfaces of the structured conductive layer 18 may be composed of an inner surface area provided by the first metallization layer 22 and an outer surface area provided by the base metallization layer 20.

Figure 2E:
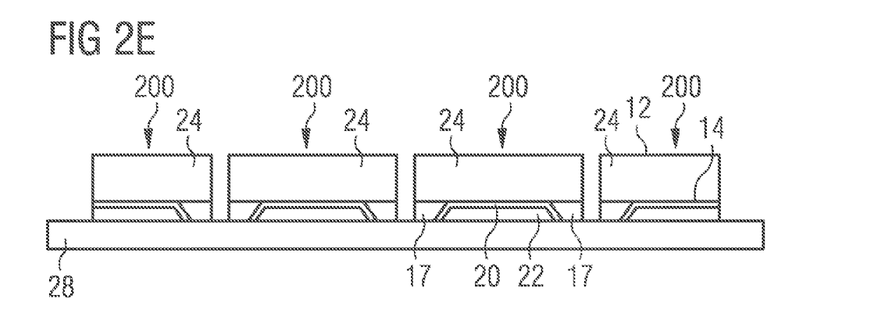

FIG. 2E illustrates dividing the semiconductor wafer 10 in semiconductor chips 24 in order to produce semiconductor devices 200. The method shown in FIG. 2E may comprise the same features as the method shown in FIG. 1E. This applies in particular to the method of dividing, the location and orientation of the division line, and the method of attaching the semiconductor chip 24 on a carrier.

FIGS. 3A-3E schematically illustrate a method of manufacturing a semiconductor device 300 in accordance with one embodiment. This method is similar to the methods described in the FIGS. 1A-1E and 2A-2E; however it comprises forming a bonding layer 26, e.g., a second metallization layer, on top of the first metallization layer 22. This bonding layer 26 may, e.g., be or comprise a bonding material, e.g., a solder material comprising Sn and/or other metals used for soldering.

Figure 3A:
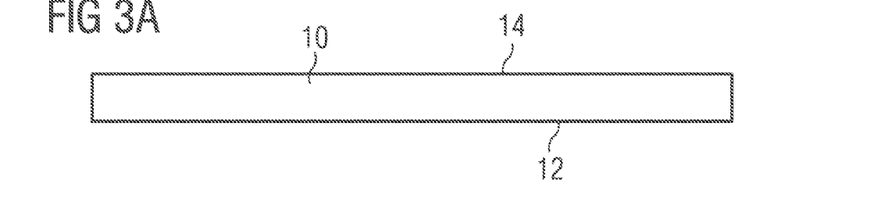
FIGS. 3A-3E schematically illustrate cross-sectional views of one embodiment of a method of manufacturing a semiconductor device.

FIG. 3A corresponds to FIGS. 1A and 2A and reference is made to the corresponding disclosure.

Figure 3B:
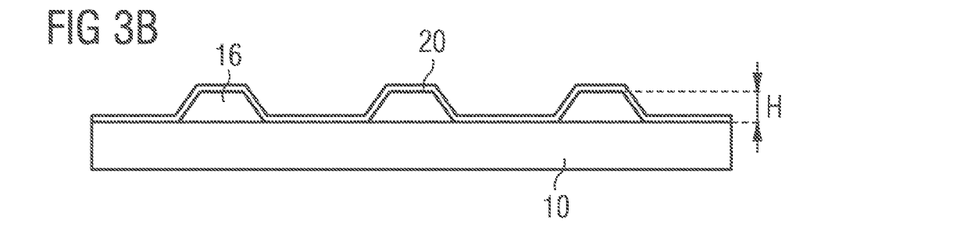

In FIG. 3B, a plurality of polymer stripes 16 is formed on the second main face 14 of the semiconductor wafer 10. The plurality of polymer stripes 16 of FIG. 3B has the same features as the plurality of polymer stripes 16 of FIG. 1B or 2B. In particular this applies to the material and the dimensions of the polymer stripes 16 and the method of forming the polymer stripes 16 and on the semiconductor wafer 10.

Figure 3C:
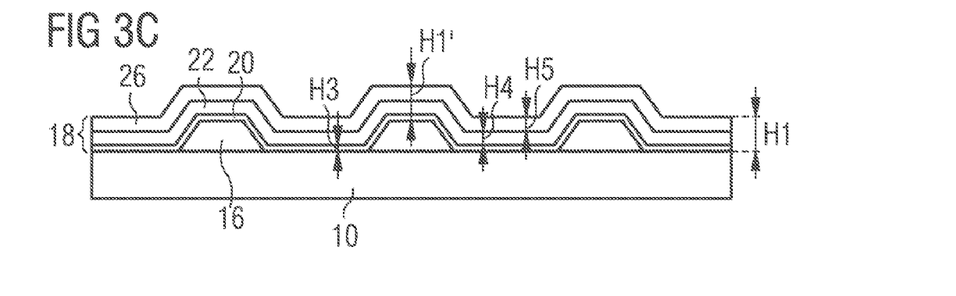

FIGS. 3B and 3C illustrate forming a conductive layer 18 on the plurality of polymer stripes 16 and on the second main face 14 of the semiconductor wafer 10. FIG. 3B illustrates forming a base metallization layer 20 on the plurality of polymer stripes 16 and on the second main face 14 of the semiconductor wafer 10 as described in conjunction with FIG. 2B.

FIG. 3C illustrates forming a first metallization layer 22 on the base metallization layer 20 and forming a bonding layer 26 on the first metallization layer 22. The first metallization layer 22 which is depicted in FIG. 3C has the same features as the first metallization layer 22 of FIG. 1C or 2C. In particular this applies to the material of the first metallization layer 22, the dimensions, and the method of forming the first metallization layer 22.

After forming the first metallization layer 22, the bonding layer 26 is formed on the first metallization layer 22. The thickness of the bonding layer 26 is H5. The thickness H1 of the conductive layer 18 is the sum of the thickness H3 of the base metallization layer 20, the thickness H4 of the first metallization layer 22 and the thickness H5 of the bonding layer 26. H4 may have the same dimensions as mentioned above. H5 may be smaller than H4. By way of example, H5 may, e.g., be smaller than 3, 5 or 10 μm.

The bonding layer 26 may consist of or comprise a second metal material. The second metal material may be a solder material, e.g., be Sn. In a specific example, the thickness H4 of the first metallization layer 22 and the thickness H5 of the bonding layer 26 are, e.g., about 5 μm and 3 μm, respectively. Both the first metallization layer 22 and the bonding layer 26 may be applied by a deposition method as mentioned above, e.g., by sputtering or plating. The bonding layer 26 may be used as a bonding material (e.g., solder) deposit after the semiconductor device 300 has been finished.

Figure 3D:
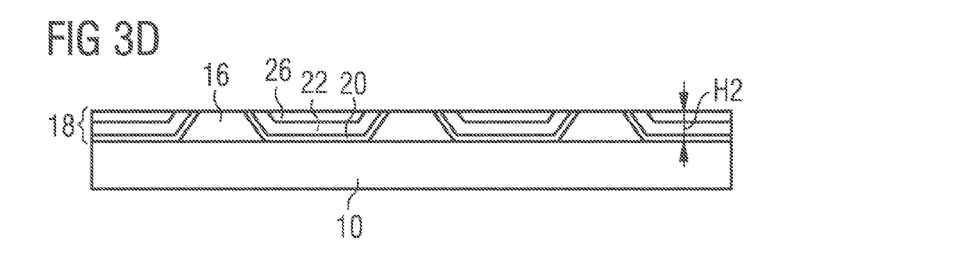

FIG. 3D illustrates planarizing the conductive layer 18 which comprises the base metallization layer 20, the first metallization layer 22 and the bonding layer 26. The method shown in FIG. 3D may comprise the same features as the method shown in FIGS. 2D and 1D. This applies in particular for the method of planarizing the conductive layer 18. By planarization, the bonding layer 26 may be structured into bond material deposits, e.g., solder deposits.

Figure 3E:
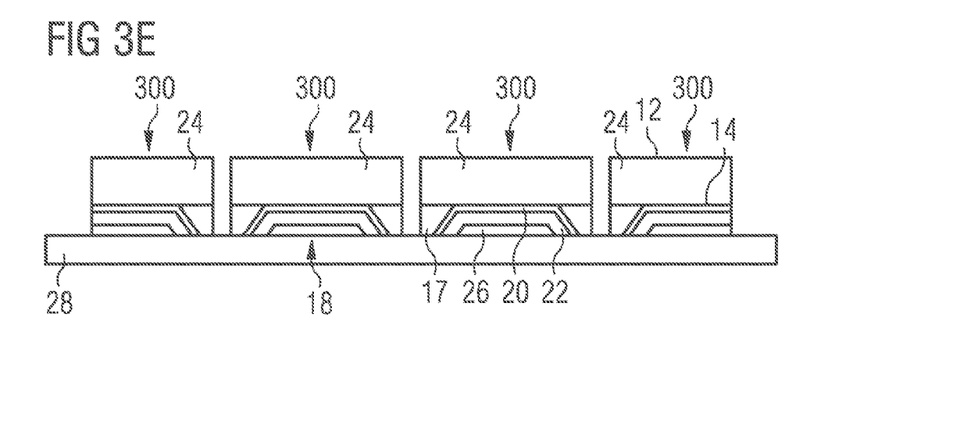

FIG. 3E illustrates dividing the semiconductor wafer 10 into single chips 24. The method shown in FIG. 3E comprises the same features as the method shown in FIG. 1E or 2E. This applies in particular to the method of dividing and the location and orientation of the division line.

The semiconductor devices 300 manufactured that way may be attached to a carrier by using the bond material of bonding layer 26. In particular, the bond material may be a bond material configured to establish diffusion solder bonds. By way of example, the bond material may comprise one or more of Sn, SnAg, SnAu, SnCu, In, InAg, InCu and InAu. The semiconductor devices 300 may be bonded to a carrier without the need to apply additional solder material, i.e., without the need to perform an additional solder deposit attach step before device mounting.

FIGS. 4A-4E schematically illustrate a method of manufacturing a semiconductor device 400 in accordance with one embodiment. This method is similar to the methods described in the FIGS. 1A-1E, 2A-2E and 3A-3E. However, compared to the embodiment of FIGS. 1A-1E, the conductive layer 18 comprises or is a metal paste layer 22'. The metal paste layer 22' may be formed by a technique such as, e.g., by scraping, squeegeeing, printing, dispensing, etc.

Figure 4A:
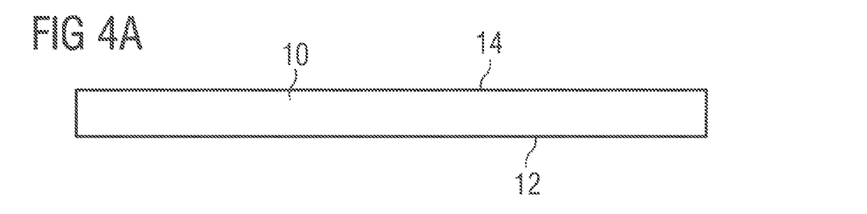
FIGS. 4A-4E schematically illustrate cross-sectional views of one embodiment of a method of manufacturing a semiconductor device.

FIG. 4A corresponds to FIGS. 1A, 2A, 3A and reference is made to the corresponding disclosure.

Figure 4B:
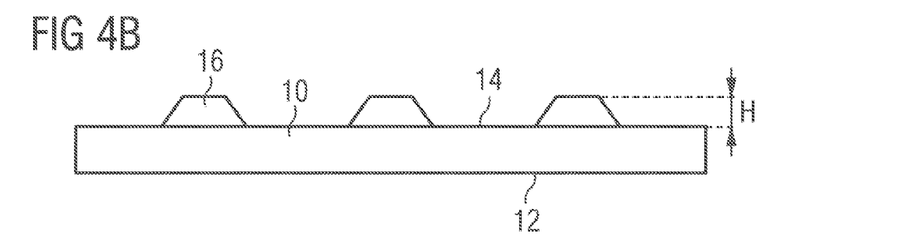

In FIG. 4B, a plurality of polymer stripes 16 is formed on the second main face 14 of the semiconductor wafer 10. The plurality of polymer stripes 16 of FIG. 4B has the same features as the plurality of polymer stripes 16 of FIGS. 1B, 2B and 3B. In particular this applies to the material and the dimensions of the polymer stripes 16 and the method of forming the polymer stripes 16 and on the semiconductor wafer 10.

Figure 4C:
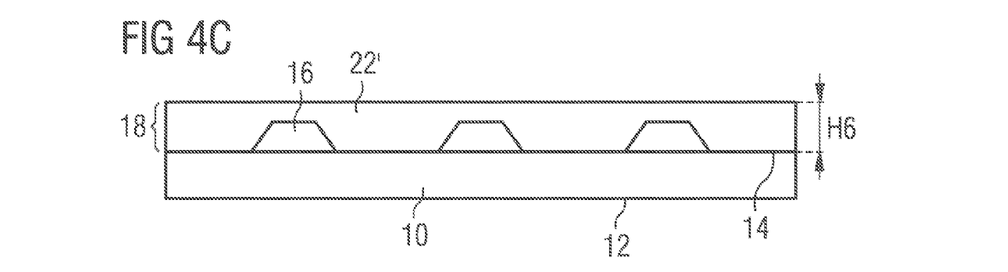

FIG. 4C illustrates forming a conductive layer 18 on the plurality of polymer stripes 16 and on the second main face 14 of the semiconductor wafer 10. In the embodiment of FIG. 4C, the conductive layer 18 may, e.g., comprise or consist of a metal paste layer 22'. The metal paste layer 22' of FIG. 4C may, e.g., comprise or consist of one or more metal paste layers. The metal paste may containing metal particles dispersed within an organic material. The metal paste may, e.g., be a nano paste, a solder paste, in particular a diffusion solder paste, and a conductive adhesive.

The thickness of the metal paste layer 22' over regions of the second main face 14 which are not covered by a polymer stripe 16 is H6. The thickness H6 may, e.g., be greater than the thickness H of the plurality of polymer stripes 16. In another case, the thickness H6 of the metal paste layer 22' may, e.g., be smaller than the thickness H of the plurality of polymer stripes 16.

The metal paste layer 22' of FIG. 4C may be applied by scraping, squeegeeing, printing, laminating, in particular laminating using a prepared foil, dispensing, spin-coating, or combination of these techniques. After forming the metal paste layer 22' of FIG. 4C using the metal paste, the plurality of polymer stripes 16 may, e.g., be completely covered by the metal paste. Further, the metal paste layer 22' may completely cover the second main face 14 of the semiconductor wafer 10.

After forming the metal paste layer 22' of FIG. 4C, the metal paste layer 22' may, e.g., be dried. After drying, the metal paste layer 22' may optionally be hardened. This may, e.g., be carried out by applying heat to the metal paste layer 22'. By heating the metal paste layer 22', the organic material may, e.g., be cured, pre-cured or evaporated. By way of example, the organic material may be a B-stage polymer material.

Figure 4D:
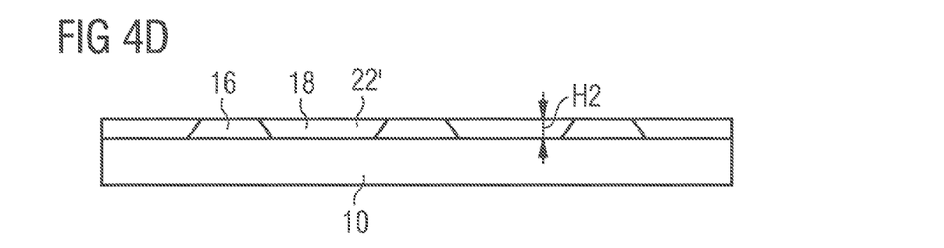

FIG. 4D illustrates planarizing the conductive layer 18 which comprises or consists of the metal paste layer 22'. The method shown in FIG. 4D may comprise the same features as the methods shown in FIGS. 1D, 2D and 3D. This applies in particular to the method of planarizing the conductive layer 18 or to the method of planarizing the conductive layer 18 and the plurality of polymer stripes 16. FIG. 4D shows that after planarizing the conductive layer 18 (e.g., the metal paste layer 22') and the plurality of polymer stripes 16, the plurality of polymer stripes 16 may be exposed and the conductive layer 18 is structured. However, as explained earlier, it may also be the case that a thin residual metal paste layer still covers the top of the polymer stripes 16.

Figure 4E:
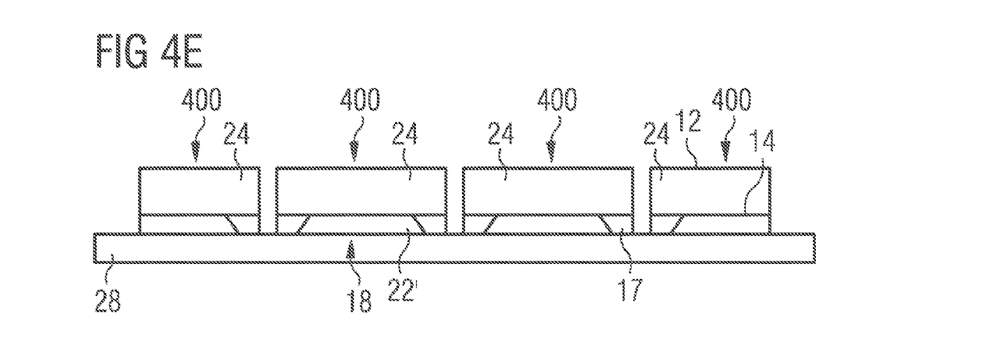

FIG. 4E illustrates dividing the semiconductor wafer 10 into single chips 24 to produce semiconductor devices 400. The method shown in FIG. 4E may comprise the same features as the method shown in FIGS. 1E, 2E and 3E. This applies in particular to the method of dividing and the location and orientation of the division line.

The individual semiconductor devices 400 may then be attached to a carrier (e.g., lead frame). In some cases, the structured metal paste layer 22' may be used as a bonding material. In these cases, no additional bonding material may be necessary.

FIGS. 5A-5E schematically illustrate a method of manufacturing a semiconductor device 500 in accordance with one embodiment. This method is similar to the methods described in FIGS. 1A-1E, 2A-2E, 3A-3E and 4A-4E. However, compared to the embodiment of FIGS. 4A-4E, a base metallization layer 20 is applied on the plurality of polymer stripes 16 and on the second main face 14 of the semiconductor wafer 10 before applying the metal paste layer 22'.

Figure 5A:
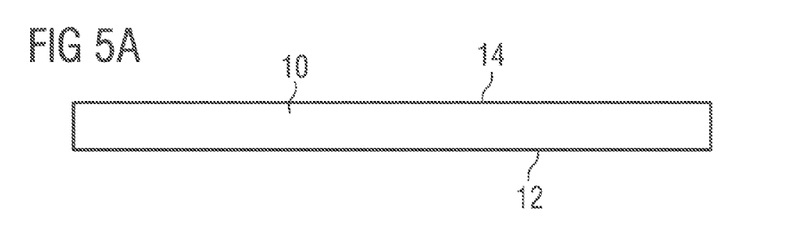
FIGS. 5A-5E schematically illustrate cross-sectional views of one embodiment of a method of manufacturing a semiconductor device.

FIG. 5A corresponds to FIGS. 1A, 2A, 3A and 4A and reference is made to the corresponding disclosure.

Figure 5B:
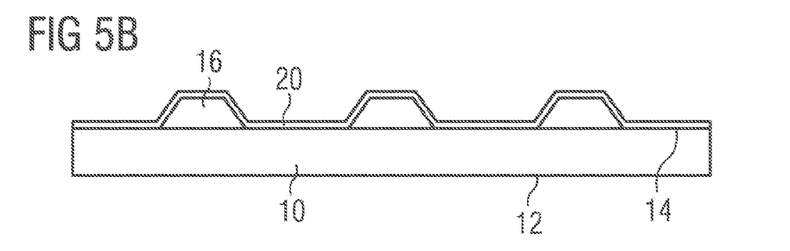

In FIG. 5B, a plurality of polymer stripes 16 is formed on the second main face 14 of the semiconductor wafer 10. The plurality of polymer stripes 16 of FIG. 5B has the same features as the plurality of polymer stripes 16 of FIGS. 1B, 2B, 3B and 4B. In particular this applies to the material and the dimensions of the polymer stripes 16 and the method of forming the polymer stripes 16 and on the semiconductor wafer 10.

Figure 5C:
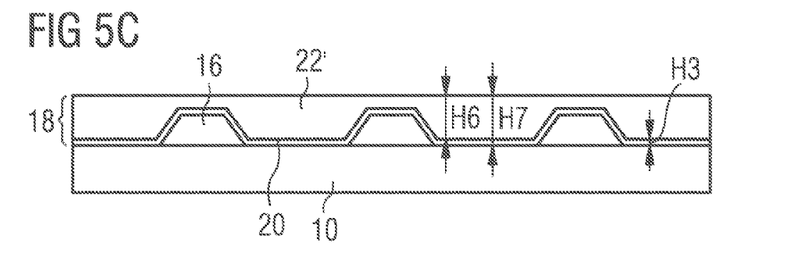

FIGS. 5B and 5C illustrate forming a conductive layer 18 on the plurality of polymer stripes 16 and on the second main face 14 of the semiconductor wafer 10. FIG. 5B illustrates forming the base metallization layer 20 on the plurality of polymer stripes 16 and on the second main face 14 of the semiconductor wafer 10. The method of forming the base metallization layer 20 may comprise the same features as the method and device shown in FIG. 2B or FIG. 3B. This applies in particular to the material and dimensions of the base metallization layer 20 and the method of forming the base metallization layer 20.

FIG. 5C illustrates forming the metal paste layer 22' on the base metallization layer 20. The metal paste layer 22' of FIG. 5C may have the same features as the metal paste layer 22' of FIG. 4C. In particular this applies to the material(s) of the metal paste layer 22' and the method of forming the metal paste layer 22'. The thickness H7 of the conductive layer 18 is the sum of the thickness H6 of the metal paste layer 22' and the thickness H3 of the base metallization layer 20. The thickness H7 of the conductive layer 18 may, e.g., be greater than the thickness H of the plurality of polymer stripes 16. However in another case, the thickness H7 of the conductive layer 18 may, e.g., be smaller than the thickness H of the plurality of polymer stripes 16. The thickness H7 may be in the same range as the thickness H6 of FIG. 4C.

After forming the metal paste layer 22' of FIG. 5C, the same steps as mentioned above may be used, e.g., to dry and/or harden the metal paste layer 22'.

Figure 5D:
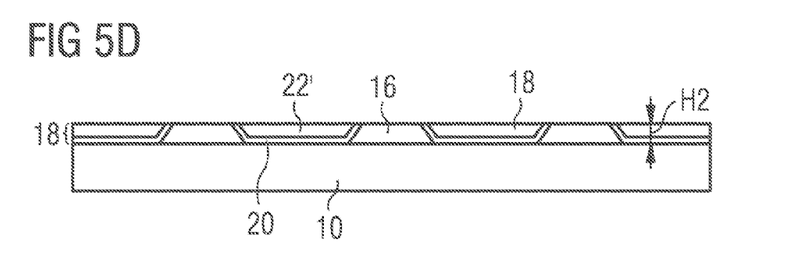

FIG. 5D illustrates planarizing the conductive layer 18 which comprises the base metallization layer 20 and the metal paste layer 22'. The method shown in FIG. 5D may comprise the same features as the method shown in FIGS. 1D, 2D, 3D and 4D.

Figure 5E:
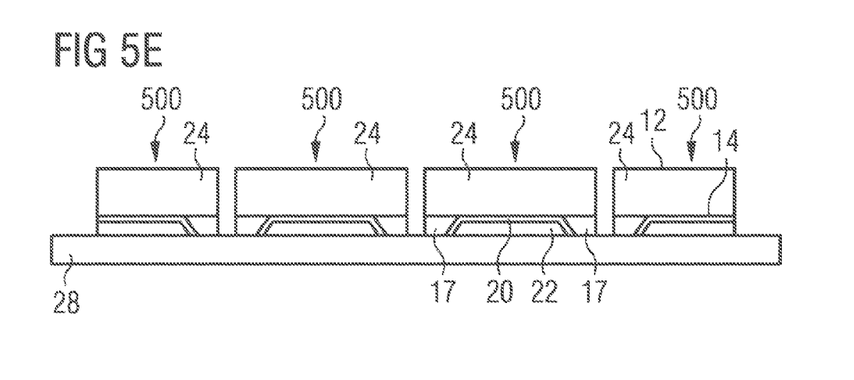

FIG. 5E illustrates dividing the semiconductor wafer 10 into single chips 24 to produce semiconductor devices 500. The method shown in FIG. 5E may comprise the same features as the method shown in FIGS. 1E, 2E, 3E and 4E. This applies in particular to the method of dividing, the location and orientation of the division line, and the method of attaching the semiconductor chip 24 on a carrier.

Figure 6:
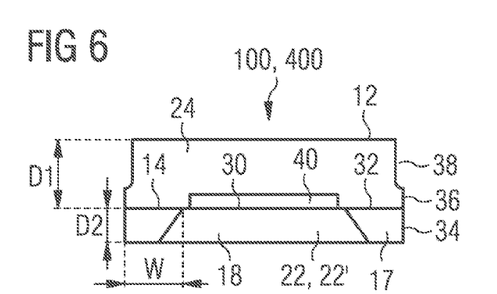
FIG. 6 schematically illustrates a cross-sectional view of one embodiment of a semiconductor device.

FIG. 6 schematically illustrates a cross-section of semiconductor devices 100 and 400. The semiconductor device 100, 400 comprises a semiconductor chip 24 having a first main face 12 and a second main face 14.

The semiconductor chip 24 may, e.g., be a logic integrated circuit and the conductive layer 18 may, e.g., be a backside heat sink. The backside heat sink may not be electrically coupled to the logic integrated circuit, i.e., may not constitute a chip electrode. In other cases, the conductive layer 18 may be electrically coupled to the logic integrated circuit by through vias running through the chip.

The semiconductor chip 24 may, e.g., be a power semiconductor chip having a backside electrode 40 at the second main face 14. The backside electrode 40 is electrically connected to the active structure implemented in the semiconductor chip

24. By way of example, the backside electrode 40 may be an electrode of a power semiconductor chip 24. The backside electrode 40 may, e.g., be the drain electrode of a MOSFET or a JFET, the collector electrode of an IGBT or a bipolar transistor or the anode of a diode. During operation, voltages higher than 5, 50, 100, 500 or even 1000 V may be applied between the backside electrode 40 and a front side electrode (not shown) of such power semiconductor chip 24.

The semiconductor device 100, 400 may, e.g., comprise a structured conductive layer 18 which is arranged on a first region 30 of the second main face 14 of the semiconductor chip 24. The conductive layer 18 may, e.g., be coupled to the drain electrode 40 of a power transistor or an anode of a power diode. Still further, the semiconductor device 100, 400 comprise a polymer structure 17 on a second region 32 of the second main face 14 of the semiconductor chip 24, see FIGS. 9 and 10. The second region 32 is a peripheral region of the second main face 14 of the semiconductor chip 24 and the first region 30 is adjacent to the second region 32. The first region 30 and the second region 32 may, e.g., sum up to the total area or surface of the second main face 14 of the semiconductor chip 24.

The first region 30 may, e.g., have a rectangular or square shape. The second region 32 may, e.g., have a shape of a closed frame which surrounds the shape of the first region 30.

The thickness D1 of the semiconductor chip 24 corresponds to the thickness T of the wafer 10 and may, e.g., be smaller than 100 µm, in particular smaller than 60 µm, and more in particular smaller than 40 µm or even 30 µm.

Figure 7:
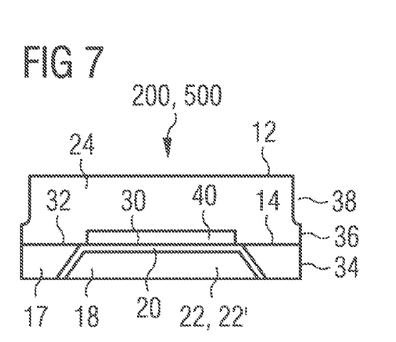
FIG. 7 schematically illustrates a cross-sectional view of one embodiment of a semiconductor device.
Figure 8:
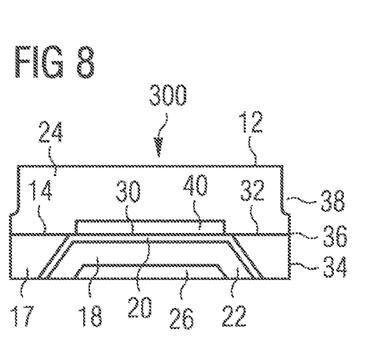
FIG. 8 schematically illustrates a cross-sectional view of one embodiment of a semiconductor device.

A lateral face 34 of the polymer structure 17 may, e.g., be flush with a lateral face 36 of the semiconductor chip 24, see e.g., FIGS. 6-8. This means that the lateral face 34 of the polymer structure 17 lies in the same plane as the lateral face 36 of the semiconductor chip 24. The lateral faces 34 and 36 lie on the same side of the semiconductor device 100, 400. That is, a common lateral face 34, 36 of the semiconductor chip 24 and the polymer structure 17 may be generated when the semiconductor wafer 10 comprising the polymer stripes 16 on the second main face 14 is singulated into single semiconductor chips 24 or semiconductor devices 100, 400 as described before in conjunction with FIGS. 1E and 4E.

The polymer structure 17 may, e.g., comprise or consist of an imide, in particular a photoimide, a photoresist, a thermosetting material or a thermo-plastic material. The polymer structure 17 may, e.g., have a thickness D2 corresponding to the thickness H2 between 3 and 20 µm, in particular between 9 and 15 µm, and a width W between 2 and 50 µm, in particular between 5 and 30 µm. The width W of the polymer structure 17 may, e.g., decrease from the second main face 14 in a direction away from the semiconductor chip 24. The width W of the polymer structure 17 may, e.g., also be constant from the second main face 14 in a direction away from the semiconductor chip 24.

The conductive layer 18 of FIG. 6 may, e.g., comprise or consist of the first metallization layer 22 of the first metal as used for semiconductor device 100. In this case, the semiconductor device 100 of FIG. 6 may, e.g., be manufactured by the method shown in FIGS. 1A-1E.

The conductive layer 18 of FIG. 6 may, e.g., comprise or consist of the metal paste layer 22' of a metal paste as used for semiconductor device 400. In this case, the semiconductor device 400 of FIG. 6 may, e.g., be manufactured by the method shown in FIGS. 4A-4E.

The conductive layer 18 may, e.g., have a thickness between 0.5 and 50 µm or 0.5 and 25 µm, in particular between 1 and 10 µm, more in particular between 2 and 7 µm. Further, the thickness of the conductive layer 18 may be greater or smaller than 1, 3, 10, 15, 20, 25, 30 or 50 µm.

A surface of the polymer structure 17 facing away from the semiconductor chip 24 and a surface of the conductive layer 18 facing away from the semiconductor chip 24 may, e.g., lie in the same plane as shown in FIG. 6. The polymer structure 17 and the conductive layer 18 may, e.g., be identical in thickness, as shown in FIG. 6. The lateral face 36 of the semiconductor chip 24 may, e.g., have a recess 38 in an upper region of the lateral face 36. The reason for this recess 38 may, e.g., be a step cut caused by partially sawing the semiconductor wafer 10 using a saw blade of greater width and then completing the singulation by using a saw blade of smaller width.

FIG. 7 schematically illustrates a cross-section of semiconductor devices 200 and 500. The semiconductor devices 200, 500 of FIG. 7 are similar to the semiconductor devices 100, 400 of FIG. 6, and reference is made to the above disclosure to avoid reiteration; however the conductive layer 18 has a different composition.

The semiconductor chip 24 of FIG. 7 comprises the same features as the semiconductor chip 24 of FIG. 6. This applies in particular to the type, dimensions, orientation, arrangement and components. The polymer structure 17 of the semiconductor device 100 of FIG. 7 comprises the same features as the polymer structure 17 of the semiconductor device 100 of FIG. 6. This applies in particular to the dimensions, orientation and arrangement. The arrangement of the semiconductor chip 24 and the polymer structure 17 with the respect to the conductive layer 18 in FIG. 7 shows the same features as the arrangement of these components in FIG. 6.

The conductive layer 18 of FIG. 7 according to semiconductor device 200 (or semiconductor device 500) may, e.g., comprise a base metallization layer 20 and a first metallization layer 22 (or metal paste layer 22'), wherein the base metallization layer 20 is arranged between the polymer structure 17 and the second main face 14 of the semiconductor chip 24 at one side and the first metallization layer 22 (or metal paste layer 22') at the other side. The first metallization layer 22 comprises the same features as the first metallization layer 22 of FIG. 6 and the metal paste layer 22' comprises the same features as the metal paste layer 22' of FIG. 6. This applies in particular to the dimensions, orientation, arrangement and components. The base metallization layer 20 may, e.g., have a thickness between 50 and 2000 nm, in particular between 200 and 1000 nm.

The semiconductor device 200 of FIG. 7 may be manufactured by the method exemplified in FIGS. 2A-2E and the semiconductor device 500 of FIG. 7 may be manufactured by the method exemplified in FIGS. 5A-5E. Reference is made to the corresponding description to avoid reiteration.

FIG. 8 schematically illustrates a cross-section of a semiconductor device 300. The semiconductor device 300 of FIG. 8 is similar to the semiconductor device 100 of FIG. 6 and 200 of FIG. 7; however the conductive layer 18 has a different composition. Compared to semiconductor devices 100, 200, the semiconductor device 300 of FIG. 8 further comprises a bonding layer 26.

As to the components of semiconductor device 300 which have already been described in the context of semiconductor devices 100 or 200, reference is made to the corresponding disclosure. The conductive layer 18 of FIG. 8 may, e.g., comprise the bonding layer 26 of a second material. The bonding layer 26 may, e.g., cover the first metallization layer 22. The second material may, e.g., be a bonding material such as, e.g., a solder material or a conductive adhesive. The semiconductor device 300 of FIG. 8 may, e.g., be manufactured by the method shown in FIGS. 3A-3E.

Semiconductor devices 100 to 500 are merely examples and several modifications of these exemplary devices 100 to 500 and combinations of specific features exemplified by devices 100 to 500 are possible. By way of example, the semiconductor device 300, as illustrated in FIG. 8, may also be designed without having a base metallization layer 20 similar to semiconductor devices 100, 400. In this case, the conductive layer 18 of semiconductor device 300 has a first metallization layer 22 and a bonding layer 26. Further, the semiconductor devices 400, 500 using a metal paste layer 22' may also be equipped with an additional bond material layer similar to the bonding layer 26 of FIG. 8.

Figure 9:
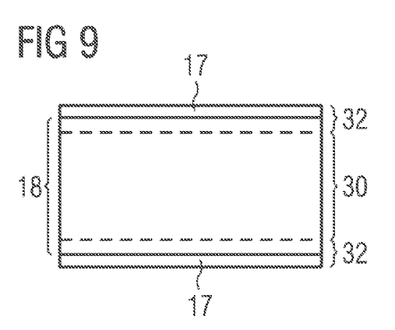
FIG. 9 schematically illustrates a bottom view of one embodiment of a semiconductor device.

FIG. 9 schematically illustrates a bottom view (footprint) of the semiconductor devices 100 to 500 in accordance with one embodiment. FIG. 9 shows the planarized surfaces of the conductive layer 18 and of the polymer structure 17. The first region 30 is defined as the region of the second main face 14 of the semiconductor chip 24 where the conductive layer 18 is arranged. The second region 32 is defined accordingly as the region of the second main face 14 of the semiconductor chip 24 where the polymer structure 17 is arranged. The second region 32 may, e.g., be a peripheral region of the second main face 14 of the semiconductor chip 24 and the first region 30 may, e.g., be adjacent and in between portions of the second region 32. The dashed lines illustrate the separation lines between the first region 30 and (portions of) the second region 32.

In FIG. 9, two portions of the second region 32 running along two opposite edges of the semiconductor chip 24 are shown. As the width of the polymer structure 17 may decrease from the second main face 14 in a direction away from the semiconductor chip 24, the second region 32 is larger than the area of the polymer structure 17 on the bottom side of semiconductor devices 100 to 500, as can be seen in FIG. 9.

The second main face 14 of the semiconductor chip 24 may, e.g., have a rectangular, in particular quadratic shape. The second region 32 may, e.g., have the shape of at least one stripe comprising at least one straight edge of the second main face 14 of the semiconductor chip 24. In the embodiment of FIG. 9, the second region 32 comprises two stripes which are arranged parallel to each other on two opposite edges of the second main face 14 of the semiconductor chip 24. The second region 32 may, e.g., completely cover two opposing edges of the second main face 14 of the semiconductor chip 24, as shown in the embodiment of FIG. 9. The first region 30 lies in between the two stripes of the second region 32. The first region 30 may, e.g., have a quadratic or rectangular shape, wherein the latter is shown in the embodiment of FIG. 9. The area of the first region 30 may, e.g., be at least 80%, in particular at least 90%, in more particular at least 95% of the area of the second main face 14 of the semiconductor chip 24.

Figure 10:
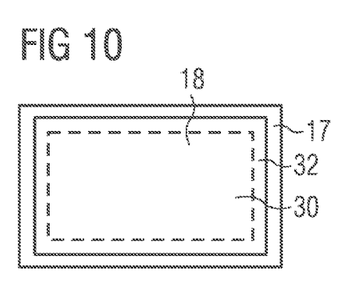
FIG. 10 schematically illustrates a bottom view of one embodiment of a semiconductor device.

FIG. 10 schematically illustrates a bottom view (footprint) of the semiconductor devices 100 to 500 in accordance with one embodiment. The embodiment of FIG. 10 is similar to the embodiment of FIG. 9; however, the design of the first region 30 and the second region 32 is different from the embodiment of FIG. 9. The second region 32 may, e.g., partly or completely surround the first region 30, wherein the latter case is shown in the embodiment of FIG. 10. In FIG. 10, the first region 30 may, e.g., have a rectangular or quadratic shape which may, e.g., be centered on the second main face 14 of the semiconductor chip 24, and the second region 32 may, e.g., have a shape of a closed frame with, e.g., a substantially constant width which completely surrounds the first region 30. In FIG. 10, the combined area of the first region 30 and the second region 32 may, e.g., be rectangular or quadratic and may, e.g., equal the area of the second main face 14 of the semiconductor chip 24. Again, the area of the first region 30 may, e.g., be at least 80%, in particular at least 90%, and more in particular at least 95% of the area of the second main face 14 of the semiconductor chip 24.

Figure 11:
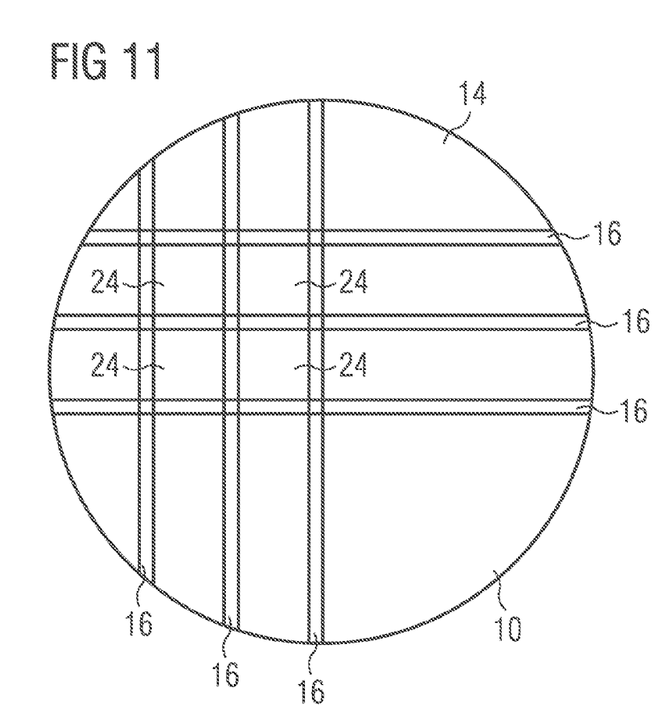
FIG. 11 schematically illustrates a bottom view of a wafer having a structured backside conductive layer.

FIG. 11 schematically illustrates a bottom view of one embodiment of a semiconductor arrangement. FIG. 11 shows a semiconductor wafer 10 seen from the bottom (i.e., backside). A plurality of polymer stripes 16 is arranged on the semiconductor wafer 10. The plurality of polymer stripes 16 comprises a first plurality of parallel polymer stripes 16 and a second plurality of parallel polymer stripes 16 wherein each polymer stripe 16 of the first plurality is orthogonal to each polymer stripe 16 of the second plurality. The first plurality and the second plurality of polymer stripes 16 may be arranged equidistantly wherein the distance between adjacent polymer stripes 16 of the first plurality may be different or may be the same as the distance between adjacent polymer stripes 16 of the second plurality. Between the pluralities of polymer stripes 16, there is at least one semiconductor chip 24 which is to be singulated. The polymer stripes 16 are arranged on second regions 32 of the wafer backside (i.e., the second main face 14 of the wafer 10). Regions between the polymer stripes 16 are first regions 30 where the (structured or unstructured) conductive layer 18 (not shown) is arranged. If structured, the conductive layer 18 is split into insular lands (not shown) separated from each other by polymer stripes 16, see also FIG. 10. The semiconductor chips 24 are singulated by separating or dividing, in particular by sawing or laser dicing, e.g., stealth dicing, the semiconductor wafer 10 along the first plurality of polymer stripes 16 and/or along the second plurality of polymer stripes 16 as described above.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
a semiconductor chip comprising a first main face and a second main face, wherein the second main face is a backside of the semiconductor chip;
a continuous electrically conductive layer arranged over the second main face of the semiconductor chip; and
a polymer structure arranged over the second main face of the semiconductor chip, wherein the polymer structure comprises at least two stripes running along opposite edges of the second main face, wherein the electrically conductive layer and stripe-facing side boundaries thereof are located laterally between the at least two stripes.

2. The semiconductor device of claim 1, wherein a thickness of the semiconductor chip is smaller than 100 μm.

3. The semiconductor device of claim 1, wherein the area of the electrically conductive layer arranged over the second main face of the semiconductor chip is at least 80%, in particular at least 90% of the second main face of the semiconductor chip.

4. The semiconductor device of claim 1, wherein a lateral face of the polymer structure is flush with a lateral face of the semiconductor chip.

5. The semiconductor device of claim 1, wherein the polymer structure comprises an imide, selected from the group consisting of a photoimide, a photoresist, a thermosetting material or a thermoplastic material.

6. The semiconductor device of claim 1, wherein the polymer structure has a thickness between 3 and 50 µm.

7. The semiconductor device of claim 1, wherein the polymer structure has a width between 2 and 50 µm.

8. The semiconductor device of claim 1, wherein a width of the polymer structure decreases from the second main face in a direction away from the semiconductor chip.

9. The semiconductor device of claim 1, wherein the polymer structure and the electrically conductive layer are identical in thickness.

10. The semiconductor device of claim 1, wherein a surface of the polymer structure facing away from the semiconductor chip and a surface of the electrically conductive layer facing away from the semiconductor chip are level with each other.

11. The semiconductor device of claim 1, wherein the electrically conductive layer comprises a first metallization layer of a first material, the first material comprising one of Cu or Sn, or an alloy of one or more of these metals.

12. The semiconductor device of claim 11, wherein the electrically conductive layer further comprises a bonding layer of a second material, the bonding layer covers the first metallization layer and the second material is a solder material or a conductive adhesive.

13. The semiconductor device of claim 1, wherein the electrically conductive layer comprises a metal paste layer, in particular one or more of a nano paste layer, a solder paste layer and a conductive adhesive.

14. The semiconductor device of claim 1, wherein the electrically conductive layer comprises a base metallization layer, the base metallization layer comprising at least one material selected from the group consisting of Au, Al, Ti, W, Cr, NiCo, Co, Cu, Sn, Ni, NiV, NiSn, Au, Ag, Pt, Pd, and an alloy of one or more of these metals.

15. The semiconductor device of claim 1, wherein the semiconductor chip is a power transistor or a power diode and the electrically conductive layer is coupled to drain electrode or a collector electrode of the power transistor or to an anode of the power diode.

16. The semiconductor device of claim 1, wherein the semiconductor chip is a logic integrated circuit and the conductive layer is a backside heat sink.

17. The semiconductor device of claim 1, wherein the thickness of the semiconductor chip is less than the thickness of one or both of the electrically conductive layer and the polymer structure.

18. A semiconductor arrangement, comprising:
a semiconductor wafer; and
a structured conductive layer arranged on a backside of the semiconductor wafer, the structured conductive layer is split into insular lands separated from each other by polymer stripes, wherein the polymer stripes run along separation lines for separating the wafer into semiconductor chips.

19. A semiconductor arrangement, comprising:
a semiconductor wafer comprising a semiconductor chip, the semiconductor chip being separated from an adjacent semiconductor chip by a dicing region, the semiconductor chip comprising active circuitry disposed at a front side of the semiconductor wafer;
the semiconductor chip and the adjacent semiconductor chip each comprising a back side metallization layer disposed at an opposite back side of the semiconductor wafer; and
a polymer strip disposed under the back side of the semiconductor wafer, wherein the polymer strip is disposed directly underneath the dicing region and extends into a peripheral region of the semiconductor chip, the polymer strip separating the back side metallization layer under the semiconductor chip from the back side metallization layer of the adjacent semiconductor chip.

\* \* \* \* \*